United States Patent
Park et al.

(10) Patent No.: US 11,309,890 B1
(45) Date of Patent: Apr. 19, 2022

(54) PRE-EMPHASIS CIRCUIT, METHOD AND DISPLAY DEVICE

(71) Applicants: Beijing ESWIN Computing Technology Co., Ltd., Beijing (CN); Hefei ESWIN IC Technology Co., Ltd., Hefei (CN)

(72) Inventors: Sangmin Park, Beijing (CN); Jangjin Nam, Beijing (CN)

(73) Assignees: Beijing ESWIN Computing Technology Co., Ltd.; Hefei ESWIN IC Technology Co., Ltd.

( * ) Notice: Subject to any disclaimer, the term of this patent is extended or adjusted under 35 U.S.C. 154(b) by 0 days.

(21) Appl. No.: 17/431,622

(22) PCT Filed: May 24, 2021

(86) PCT No.: PCT/CN2021/095542
§ 371 (c)(1),
(2) Date: Aug. 17, 2021

(30) Foreign Application Priority Data

Dec. 14, 2020 (CN) .......................... 202011475365.1

(51) Int. Cl.
*G11C 19/00* (2006.01)
*H03K 19/0175* (2006.01)
*G09G 3/20* (2006.01)

(52) U.S. Cl.
CPC ........... *H03K 19/0175* (2013.01); *G09G 3/20* (2013.01); *G09G 2310/0289* (2013.01)

(58) Field of Classification Search
None
See application file for complete search history.

(56) References Cited

U.S. PATENT DOCUMENTS

| | | | | |
|---|---|---|---|---|
| 11,069,276 | B2 * | 7/2021 | Lim | G09G 3/20 |
| 2007/0040855 | A1 * | 2/2007 | Kato | G09G 3/3696 |
| | | | | 345/690 |
| 2009/0066681 | A1 * | 3/2009 | Kim | G09G 3/3685 |
| | | | | 345/210 |
| 2010/0134472 | A1 * | 6/2010 | Chang | G09G 5/10 |
| | | | | 345/212 |

(Continued)

FOREIGN PATENT DOCUMENTS

| CN | 101751842 A | 6/2010 |
|---|---|---|
| CN | 103377627 A | 10/2013 |

(Continued)

OTHER PUBLICATIONS

International Search Report for Application No. PCT/CN2021/095542 dated Sep. 13, 2021, 5 Pages.

*Primary Examiner* — Tuan T Lam
(74) *Attorney, Agent, or Firm* — Lerner, David, Littenberg, Krumholz & Mentlik, LLP (57) ABSTRACT

The present disclosure provides a pre-emphasis circuit, method and display device, and belongs to a field of display driving. The pre-emphasis circuit according to the disclosure can determine whether to output a pre-emphasis voltage corresponding to grayscale of current input data via an input terminal of an amplifier according to data input to a data terminal by adding an amplifier input pre-emphasis module. Rapid conversion of output voltage can be realized without increasing the quiescent current of the amplifier, while the stability of temperature of the IC is ensured.

20 Claims, 6 Drawing Sheets

(56) References Cited

U.S. PATENT DOCUMENTS

| | | | |
|---|---|---|---|
| 2013/0286002 A1 | 10/2013 | Huang | |
| 2014/0139270 A1* | 5/2014 | Huang | G09G 3/00 327/109 |
| 2015/0243230 A1* | 8/2015 | Kim | G09G 3/3611 345/690 |
| 2016/0098959 A1* | 4/2016 | Moon | G09G 3/3696 345/205 |
| 2016/0125832 A1* | 5/2016 | Hwang | G09G 3/3696 345/212 |
| 2017/0249005 A1* | 8/2017 | Hwang | G09G 3/2092 |
| 2018/0211579 A1 | 7/2018 | Bae et al. | |
| 2018/0336816 A1* | 11/2018 | Shin | G09G 3/3688 |
| 2019/0197964 A1* | 6/2019 | Cho | G09G 3/3275 |
| 2021/0074216 A1* | 3/2021 | Kim | G09G 3/3266 |
| 2021/0090527 A1* | 3/2021 | Lee | G09G 3/20 |

FOREIGN PATENT DOCUMENTS

| | | |
|---|---|---|
| CN | 104269157 A | 1/2015 |
| CN | 112615616 A | 4/2021 |

\* cited by examiner

PRE-EMPHASIS CIRCUIT, METHOD AND DISPLAY DEVICE

CROSS-REFERENCE TO RELATED APPLICATIONS

The present application is a national phase entry under 35 U.S.C. § 371 of International Application No. PCT/CN2021/095542, filed May 24, 2021, which claims priority from Chinese Patent Application No. 202011475365.1, filed Dec. 14, 2020, all of which are incorporated herein by reference.

TECHNICAL FIELD

The present disclosure relates to a field of display driving, and in particular, to a pre-emphasis circuit, method and display device.

BACKGROUND

A Source Driver Integrate Circuit (IC) of a display screen recombines an input digital signal into an analog signal to drive pixels of a panel using a Digital-Analog Converter (DAC). The higher the resolution of the display screen is, the greater the number of pixels there are. Therefore, the number of pixels that need to be driven in the same time increases, such that a driving time required to drive each pixel becomes shorter. And the larger the screen is, the greater the capacitance of the screen is. At this time, the time required to drive the pixels will also be increased. This will slow down a conversion rate of an output voltage in the source driver IC of the display panel, resulting in abnormal image quality and an increase in the temperature of the IC.

In general display source driver IC circuits, the commonly used method is to increase a quiescent current of an amplifier to increase the conversion rate. If the display screen has a resolution of 8 k or more, only increasing the current to increase the conversion rate has a limited effect. And increasing the current in this way will cause the increasing in the temperature of the IC. This problem becomes more obvious in high-definition, large-scale display devices with a resolution above 8 k.

SUMMARY

Embodiments of the present disclosure provide a pre-emphasis circuit, method and display device, which can realize rapid conversion of output voltage without increasing quiescent current of an amplifier, while ensuring stability of temperature of an IC.

In order to achieve the above objectives, the present disclosure adopts the following solutions. At one aspect, an embodiment of the present disclosure provides a pre-emphasis circuit, comprising:

a first latch configured to store received first data and output the first data;

a second latch configured to store received second data and output the second data, the second data being next to the first data;

a decoder;

a gamma voltage supplier;

a first level shifter configured to boost the first data, high-voltage data signal obtained through the boosting being used as current input data of the decoder; and an amplifier input pre-emphasis module connected to the gamma voltage supplier, the decoder, an input pre-emphasis signal terminal, the first latch and the second latch, and configured to determine whether to pre-emphasize gray-scale voltage corresponding to the current input data according to a value of a designated bit of the first data and a value of a designated bit of the second data, an input pre-emphasis signal value input via the input pre-emphasis signal terminal, and a gray-scale value corresponding to the current input data;

wherein if it is determined that the gray-scale voltage corresponding to the current input data is to be pre-emphasized, a pre-emphasis voltage is output to the decoder, the pre-emphasis voltage being a voltage obtained by pre-emphasizing the gray-scale voltage corresponding to the current input data; and if it is determined that the gray-scale voltage corresponding to the current input data is not to be pre-emphasized, the gray-scale voltage corresponding to the current input data is output to the decoder.

Optionally, the amplifier input pre-emphasis module comprises:

a pattern detection module connected to the first latch and the second latch, configured to determine whether it is possible to pre-emphasize the gray-scale voltage corresponding to the current input data according to the value of the designated bit of the first data and the value of the designated bit of the second data and the input pre-emphasis signal values, and output a control signal;

a pre-emphasis module connected to an output terminal of the pattern detection module, an output terminal of the gamma voltage supplier and an input terminal of the decoder, configured to determine whether to pre-emphasize the gray-scale voltage corresponding to the current input data according to the control signal provided by the pattern detection module and the gray-scale values corresponding to the current input data.

Optionally, the pattern detection module comprises an XOR gate circuit, an AND gate circuit, a D flip-flop and a second level shifter, and an input terminal of the XOR gate circuit is connected to the first latch and the second latch, and the XOR gate circuit is configured to determine whether the value of the designated bit of the first data is equal to the value of the designated bit of the second data, and output a result of the determination;

an output terminal of the XOR gate circuit is connected to a D terminal of the D flip-flop, an input terminal of the AND gate circuit is connected to a Q terminal of the D flip-flop, another input terminal of the AND gate circuit is connected to the input pre-emphasis signal terminal, and the AND gate circuit is configured to whether it is possible to pre-emphasize the gray-scale voltage corresponding to the current input data according to the result of the determination of the XOR gate circuit and the input pre-emphasis signal value; comprising:

when the value of the designated bit of the first data is not equal to the value of the designated bit of the second data, and the input pre-emphasis signal value is 1, a determination result that it is possible to pre-emphasize the gray-scale voltage corresponding to the current input data is obtained and output;

when the value of the designated bit of the first data is equal to the value of the designated bit of the second data, or the input pre-emphasis signal value is 0, a determination result of unnecessarily pre-emphasizing the gray-scale voltage corresponding to the current input data is obtained and output; and the second level shifter is connected to an output terminal of the AND gate circuit and configured to provide the control signal to the pre-emphasis module.

Optionally, the value of the designated bit of the first data and the value of the designated bit of the second data comprises:

a value D1<x> of an x-th bit of the first data, and a value D2<x> of an x-th bit of the second data.

Optionally, the x-th bits are most significant bits of the first data and/or the second data. Optionally, the pre-emphasis circuit comprises:

the gamma voltage supplier comprises a plurality of different gray-scale voltage output terminals, and the decoder comprises a plurality of gray-scale voltage input terminals corresponding to the different gray-scale voltage output terminals;

the pre-emphasis module comprises n sub-control modules, n≥1, and each of the sub-control modules is connected between a designated gray-scale voltage output terminal and a designated gray-scale voltage input terminal, and is configured to perform a pre-emphasis control on the output designated gray-scale voltage.

Optionally, the sub-control module comprises a first switch and a second switch;

an end of the first switch is connected to the designated gray-scale voltage output terminal of the gamma voltage supplier, and another end of the first switch is connected to a pre-emphasis output terminal for outputting the designated gray-scale voltage of the pre-emphasis module;

the first switch is controlled to be turned on or turned off according to a value of the control signal;

an end of the second switch is connected to a pre-emphasis input voltage, and another end of the second switch is connected to the pre-emphasis output terminal of the designated gray-scale voltage;

the second switch is controlled to be turned on or turned off according to the value of the control signal;

the pre-emphasis output terminal of the designated gray-scale voltage is connected to an input terminal of the decoder corresponding to the designated gray-scale voltage.

Optionally, each of the sub-control modules comprises a multiplexer, input terminals of the multiplexer are respectively connected to the designated gray-scale voltage output terminal of the gamma voltage supplier and a pre-emphasis input voltage terminal, and an output terminal of the multiplexer is a pre-emphasis output terminal of the designated gray-scale voltage, the pre-emphasis output terminal of the designated gray-scale voltage is connected to the input terminal of the decoder corresponding to the designated gray-scale voltage;

the multiplexer determines whether to select the pre-emphasized voltage of a designated grayscale by using the value of the control signal.

At one aspect, an embodiment of the present disclosure discloses a pre-emphasis method applied to the pre-emphasis circuit according to an embodiment of the present disclosure, the method comprises:

receiving and storing first data and second data, the second data being next to the first data;

determining whether to pre-emphasize a gray-scale voltage corresponding to current input data according to a value of a designated bit of the first data and a value of a designated bit of the second data, an input pre-emphasis signal value input via an input pre-emphasis signal terminal, and a gray-scale value corresponding to the current input data;

outputting a pre-emphasis voltage, which is a voltage obtained by pre-emphasizing the gray-scale voltage corresponding to the current input data, if it is determined that pre-emphasize the gray-scale voltage corresponding to the current input data is to be pre-emphasized;

outputting the gray-scale voltage corresponding to the current input data, if it is determined that the gray-scale voltage corresponding to the current input data is not to be pre-emphasized. Optionally, the determining whether to pre-emphasize the gray-scale voltage corresponding to the current input data according to the value of the designated bit of the first data and the value of the designated bit of the second data, the input pre-emphasis signal value input via the input pre-emphasis signal terminal, and the gray-scale value corresponding to the current input data comprises:

it is possible to pre-emphasize the gray-scale voltage corresponding to the current input data, when the value of the designated bit of the first data is not equal to the value of the designated bit of the second data, and the input pre-emphasis signal value is 1;

it is unnecessary to pre-emphasize the gray-scale voltage corresponding to the current input data, when the value of the designated bit of the first data is equal to the value of the designated bit of the second data, or the input pre-emphasis signal value is 0.

Optionally, that it is possible to pre-emphasize the gray-scale voltage corresponding to the current input data comprises:

outputting a pre-emphasis voltage which is a voltage obtained by pre-emphasizing the gray-scale voltage corresponding to the current input data, if the gray-scale value corresponding to the current input data belongs to a pre-emphasis gray-scale range;

outputting the gray-scale voltage corresponding to the current input data, if the grayscale value corresponding to the current input data does not belong to the pre-emphasis gray-scale range.

At one aspect, an embodiment of the present disclosure provides a pre-emphasis device, comprising:

a first processing module configured to receive and store first data and second data, the second data being next to the first data;

a second processing module configured to determine whether to pre-emphasize gray-scale voltage corresponding to current input data according to a value of a designated bit of the first data and a value of a designated bit of the second data, an input pre-emphasis signal value input via an input pre-emphasis signal terminal, and a gray-scale value corresponding to the current input data;

the second processing module is further configured to:

output a pre-emphasis voltage, which is a voltage obtained by pre-emphasizing the gray-scale voltage corresponding to the current input data, if it is determined that the gray-scale voltage corresponding to the current input data is to be pre-emphasized;

output the gray-scale voltage corresponding to the current input data, if it is determined that the gray-scale voltage corresponding to the current input data is not to be pre-emphasized.

At one aspect, an embodiment of the present disclosure provides a source driver chip comprising the pre-emphasis circuit according to an embodiment of the present disclosure.

At one aspect, an embodiment of the present disclosure provides a display device comprising the source driver chip according to an embodiment of the present disclosure.

At one aspect, an embodiment of the present disclosure provides an electronic device comprising a processor, a memory and computer program stored on the memory and executable on the processor, when the computer program is executed by the processor, any one of the pre-emphasis methods according to embodiments of the present disclosure is implemented.

DESCRIPTION OF REFERENCE NUMERALS

101—first latch, 102—second latch, 103—first level shifter, 104—decoder, 105—gamma voltage supplier, 106—amplifier input pre-emphasis module, 107—amplifier, 1061—pattern detection module, 1062—pre-emphasis module

DETAILED DESCRIPTION OF EMBODIMENTS

In order to make the objectives, technical solutions, and advantages of the embodiments of the present disclosure clearer, the technical solutions of the embodiments of the present disclosure will be described clearly and completely in conjunction with the accompanying drawings of the embodiments of the present disclosure. Obviously, the described embodiments are part of the embodiments of the present disclosure, rather than all of the embodiments. Based on the described embodiments of the present disclosure, all other embodiments obtained by those of skilled in the art without creative work shall fall within the protection scope of the present disclosure.

The terms "first" and "second" in the specification and claims of the present disclosure are used to distinguish similar objects, but not to describe a specific sequence or order. It should be understood that the data used in this way can be interchanged under appropriate circumstances, so that the embodiments of the present disclosure can be implemented in an order other than those illustrated or described here, and the objects distinguished by using the "first", "second", etc. are usually of one type, and the number of objects is not limited. For example, the number of the first object(s) may be one or more. In addition, "and/or" in the specification and claims means at least one of the connected objects, and the character "I" generally means that the associated objects before and after it are in an "or" relationship.

In addition, the technical features involved in the different embodiments of the present disclosure described below can be combined with each other as long as they do not conflict with each other.

Figure 1:
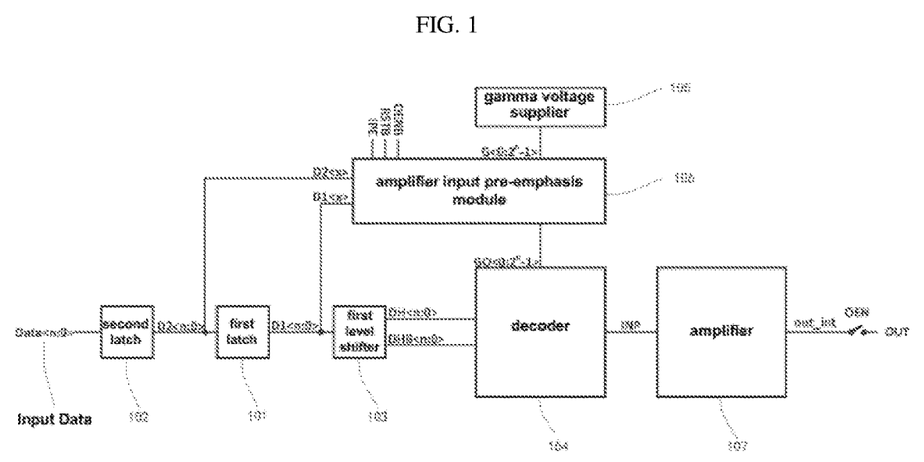
FIG. 1 is a schematic structural diagram illustrating a pre-emphasis circuit according to an embodiment of the present application.

FIG. 1 illustrates a schematic diagram of a pre-emphasis circuit according to an embodiment of the present disclosure. The pre-emphasis circuit according to the present disclosure adds an amplifier input pre-emphasis module, and the added module circuit pre-emphasizes data input to an amplifier according to data Data<n:0> input via a DAC (digital analog converter) to achieve quick voltage conversion.

Referring to FIG. 1, the pre-emphasis circuit comprises a first latch 101, a second latch 102, a first level shifter 103, a decoder 104, a gamma voltage supplier 105 and an amplifier input pre-emphasis module 106.

The first latch 101 is configured to store received first data and output the first data.

The second latch 102 is configured to store received second data and output the second data, and the second data is the next data of the first data.

The first level shifter 103 is configured to boost the first data, and use high-voltage data signal obtained through the boosting as current input data of the decoder 104.

The amplifier input pre-emphasis module 106 is connected to the gamma voltage supplier 105, the decoder 104, an input pre-emphasis signal (IPE) terminal, the first latch 101 and the second latch 102, and is configured to determine whether to pre-emphasize gray-scale voltage corresponding to the current input data according to a value of a designated bit of the first data and a value of a designated bit of the second data, an input pre-emphasis signal value input via the input pre-emphasis signal (IPE) terminal, and a gray-scale value corresponding to the current input data.

If it is determined that the gray-scale voltage corresponding to the current input data is to be pre-emphasized, a pre-emphasis voltage is output to the decoder 104, and the pre-emphasis voltage is a voltage obtained by pre-emphasizing the gray-scale voltage corresponding to the current input data.

If it is determined that the gray-scale voltage corresponding to the current input data is not to be pre-emphasized, the gray-scale voltage corresponding to the current input data is output to the decoder 104.

Through the amplifier input pre-emphasis module in the above-mentioned pre-emphasis circuit, according to change of the digital signal, Data<n:0>, at the input of the DAC, the output voltage can be converted quickly without increasing quiescent current of the amplifier. By controlling input voltage of the amplifier, gamma voltage can be changed in a specific interval while temperature stability of the IC can be ensured.

Figure 2:
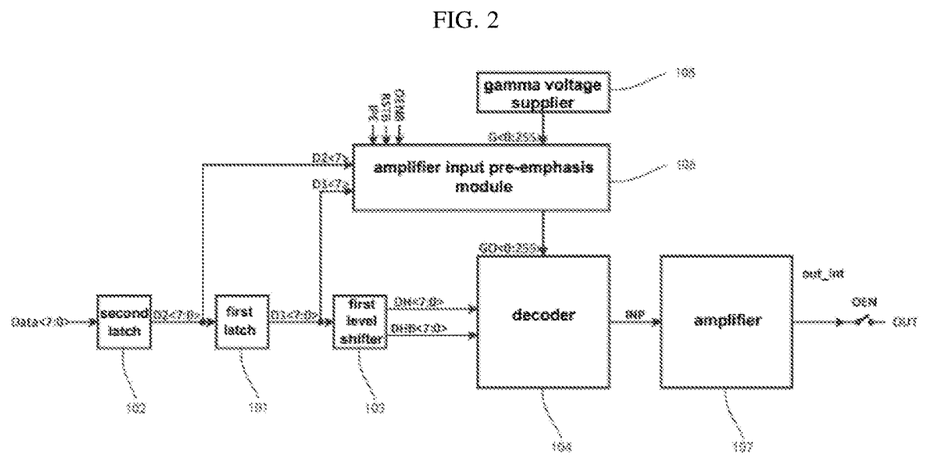
FIG. 2 is a schematic structural diagram illustrating a pre-emphasis circuit according to an embodiment of the present application.

Specifically, taking that the data input terminal is an 8-bit DAC (digital-analog converter) as an example, an operation mode of the pre-emphasis circuit according to the present disclosure is described by referring to FIG. 2 illustrating the structure diagram of the pre-emphasis circuit of the 8-bit source code driver IC.

The first latch 101 outputs the first data D1<7:0> in binary form, the second latch 102 outputs the second data D2<7:0> in binary form, and the first level shifter 103 boosts the input data D1<7:0> to obtain a high-voltage data signal DH<7:0> and an inverted signal DHB<7:0>, and output DH<7:0> and DHB<7:0> to the decoder 104.

Taking that the 7-th bits of the first data and the second data are specified as an example, the amplifier input pre-emphasis module 106 obtains the value D1<7> of the 7-th bit of the first data and the value D2<7> of the 7-th bit of the second data, and determines whether to pre-emphasize gray-scale voltage corresponding to current input data according to IPE (Input Pre-Emphasis) value and gray-scale value corresponding to the current input data; and 1 or 0 as the IPE may be input according to the specific requirements of the actual use environment.

It should be noted that <7:0> marked in FIG. 2 is data in binary form. Since an example of 8-bit is shown in FIG. 2, the binary data involved is 8-bit binary data, that is, the 0-th bit to the 7-th bit, respectively. Thus, D1<x> and D2<x> are also counted from the 0-th bit.

It should be noted that the value of the designated bit of the first data and the value of the designated bit of the second data may be compared by designating a plurality of bits of data. For example, when the 5-th bits as well as the 7-th bits of the first data and the second data are designated at the same time, two sets of designated bits are compared, and the pre-emphasis circuit enabling condition is satisfied only when the two sets of designated bits comparison conditions are both satisfied.

Figure 3:
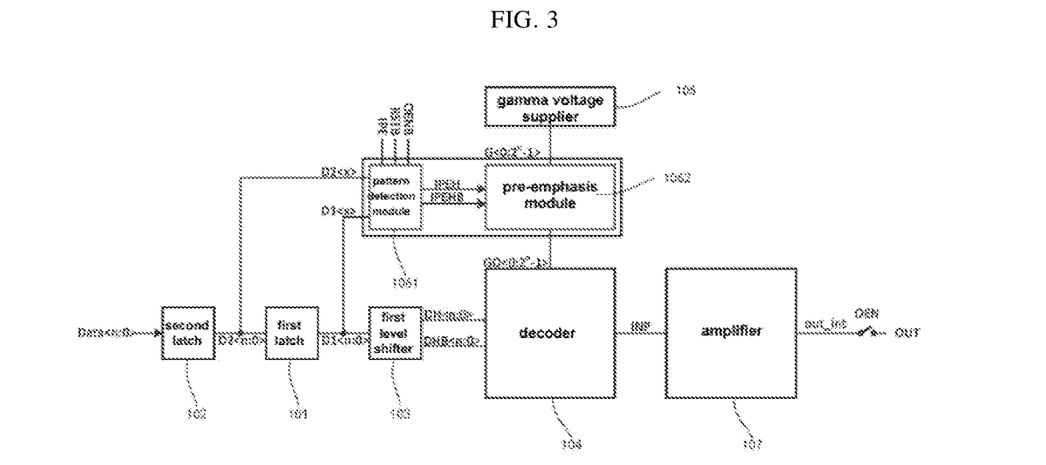
FIG. 3 is a schematic structural diagram illustrating a pre-emphasis circuit according to an embodiment of the present application.

Optionally, referring to FIG. 3, the amplifier input pre-emphasis module 106 comprises a pattern detection module 1061 connected to the first latch 101 and the second latch 102, and configured to determine whether it is possible to pre-emphasize the gray-scale voltage corresponding to the current input data according to the value of the designated bit of the first data and the value of the designated bit of the second data and the IPE values, and output a control signal.

The pre-emphasis module 1062 is connected to an output terminal of the pattern detection module 1061, an output terminal of the gamma voltage supplier 105 and an input terminal of the decoder 104, and is configured to determine whether to pre-emphasize the current input data according to the control signal provided by the pattern detection module 1061 and the gray-scale values corresponding to the current input data. The values D1<x> and D2<x> of the x-th bits of the first data and the second data are designated in FIG. 3.

Specifically, as shown in FIG. 3, in the pre-emphasis circuit according to the present disclosure, the amplifier input pre-emphasis module 106 is composed of the pattern detection module 1061 and the pre-emphasis module 1062.

The pattern detection module 1061 is configured to determine a current display pattern according to the value of the designated bit of the first data and the value of the designated bit of the second data. The voltage conversion rate needs to be accelerated only when the grayscale change of the display output exceeds a specific value. The specific value of the change is determined by the setting.

The pre-emphasis module 1062 is required to further determine whether it is necessary to pre-emphasize the gray-scale voltage corresponding to the current input data, after the pattern detection module 1061 outputs the control signal.

Therefore, rapid voltage conversion can be achieved by using the pre-emphasis circuit only when the enable ranges of the pattern detection module 1061 and the pre-emphasis module 1062 are both satisfied.

Figure 4:
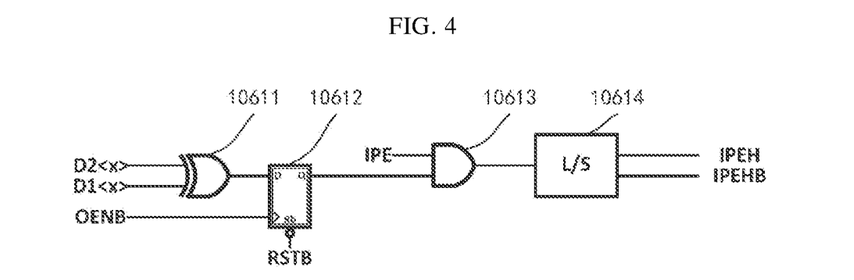
FIG. 4 is a schematic structural diagram illustrating a pattern detection module of a pre-emphasis circuit according to an embodiment of the present application.

Optionally, referring to FIG. 4, the pattern detection module 1061 comprises an XOR gate circuit 10611, an AND gate circuit 10613, a D flip-flop 10612 and a second level shifter 10614. An input terminal of the XOR gate circuit 10611 is connected to the first latch 101 and the second latch 102, and the XOR gate circuit 10611 is configured to determine whether the value of the designated bit of the input first data is equal to the value of the designated bit of the second data, and output a result of the determination.

An output terminal of the XOR gate circuit 10611 is connected to a D terminal of the D flip-flop 10612, an input terminal of the AND gate circuit 10613 is connected to a Q terminal of the D flip-flop 10612, another input terminal of the AND gate circuit 10613 is connected to the input pre-emphasis signal (IPE) terminal, and the AND gate circuit 10613 is configured to determine whether it is possible to pre-emphasize the gray-scale voltage corresponding to the current input data according to the result of the determination of the XOR gate circuit 10611 and the IPE value.

In particular, when the value of the designated bit of the first data is not equal to the value of the designated bit of the second data, and IPE=1, a determination result that it is possible to pre-emphasize the gray-scale voltage corresponding to the current input data is obtained and output.

When the value of the designated bit of the first data is equal to the value of the designated bit of the second data, or IPE=0, a determination result of unnecessarily pre-emphasizing the gray-scale voltage corresponding to the current input data is obtained and output.

The second level shifter 10614 is connected to an output terminal of the AND gate circuit 10613, and is configured to provide the control signal to the pre-emphasis module.

An Rb terminal of the D flip-flop receives an inverted signal RSTB of a reset signal with an active low level, and is configured to reset the pattern detection circuit.

A trigger terminal of the D flip-flop receives an inverted signal which is enabled by OENB output.

Specifically, the pattern detection module 1061 functions to compare whether the value of the designated bit of the first data and the value of the designated bit of the second data are the same. For example, values D1<x> and D2<x> of the x-th bit are designated, if the two are the same, it indicates that there is little change between the first data and the second data, and there is no need for fast voltage conversion, thus there is no need to pre-emphasize the input data.

If the value of the designated bit of the first data is different from the value of the designated bit of the second data, it indicates that there is large change between the first data and the second data, and the output voltage needs to be quickly converted, and pre-emphasis may be required.

Specifically, 8-bit data Data<7:0> is provided by the input terminal, taking that the 7-th bit is designated as an example, at this time, D1<7> is the MSB (Most Significant Bit) value of the first data, D2<7> is the MSB value of the second data. That is, D1 is the data that drives the current display IC, and D2 is the next data that drives the display IC. When the two values are different, it means that the display pattern changes greatly and the voltage conversion may need to be implemented quickly. Specific to the circuit, D1<7> and D2<7> are compared through the XOR gate circuit 10611.

Specifically, during the comparison, the pattern detection module 1061 compares D1<7> and D2<7> at a rising edge (from "0" to "1") of the OENB signal.

If D1<7>=D2<7>, both the XOR gate circuit 10611 and the AND gate circuit 10613 output "0". At this time, IPEH outputs "0" and IPEHB outputs "1".

If IPE=0, the AND gate circuit 10613 may output "0". At this time, IPEH may output "0" and IPEHB may output "1".

The AND gate circuit 10613 outputs "1" only when D1<x>≠D2<x> and IPE=1. At this time, IPEH outputs "1" and IPEHB outputs "0". Only this case belongs to the enable range of the pattern detection module 1061.

At this time, the control signals output by the pattern detection module 1061 to the pre-emphasis module 1062 are the IPEH and IPEHB signals.

In the above example, the case, where the designated bit of the first data and the designated bit of the second data are the 7-th bits, are compared, whether the input data belongs to the enable range of the pattern detection module 1061 is determined based on whether D1<7> equals to D2<7>.

As an example, taking x=7, that is, the most significant bits of 8-bit data Data<7:0> are compared, when IPE=1, D1∈(0,127), D2∈(0,127), D1<7>=D2<7>, the input data Data does not belong to the enable range of the pattern detection module 1061;

D1∈(0,127), D2∈(128,255), D1<7>≠D2<7>, the input data Data belongs to the enable range of the pattern detection module 1061;

D1∈(128,255), D2∈(0,127), D1<7>≠D2<7>, the input data Data belongs to the enable range of the pattern detection module 1061;

D1∈(128,255), D2∈(128,255), D1<7>=D2<7>, the input data Data does not belong to the enable range of the pattern detection module 1061.

Optionally, the pre-emphasis circuit according to the present disclosure may be set to accelerate the voltage conversion rate only when the grayscale change of the display output exceeds a specific value. Through this setting, it can effectively avoid pre-emphasizing the input data when the difference between D1 and D2 are very small but D1<x>≠D2<x>.

As an example, the specific value of grayscale change may be as follows:

1) when only D1<7> and D2<7> are compared, the specific value of grayscale change=a half of the total number of grayscales.

Example 1: 8-Bit Resolution and a Total of 256 Grayscales

The specific value of grayscale change=256/2=128 grayscales;

if D1<7>≠D2<7>, and the difference between D1 and D2 exceeds 128 grayscales, the conversion rate needs to be accelerated.

Example 2: 10-Bit Resolution and a Total of 1024 Grayscales

The specific value of grayscale change=1024/2=512 grayscales;

if D1<7>≠D2<7>, and the difference between D1 and D2 exceeds 512 grayscales, the conversion rate is accelerated.

2) when comparing D1<7> with D2<7>, and comparing D1<6> with D2<6>, the specific value of grayscale change=a quarter of the total number of grayscales.

Example 1: 8-Bit Resolution and a Total of 256 Grayscales

The specific value of grayscale change=256/4=64 grayscales;

if the difference between D1<7> and D2<7> or between D1<6> and D2<6> exceeds 64 grayscales, the conversion rate needs to be accelerated.

Example 2: 10-Bit Resolution and a Total of 1024 Grayscales

The specific value of grayscale change=1024/4=526 grayscales;

if the difference between D1<7> and D2<7> or between D1<6> and D2<6> exceeds 256 grayscales, the conversion rate is accelerated.

Using different values D1<x> and D2<x> of the designated bits of the first data and the second data, or using the values of multiple sets of designated bits of the first data and the second data, more precise pattern change can be detected.

Specifically, for example, x=6 can be set for 8-bit data, and D1<6> and D2<6> can be compared, which can change the change range of the first data and the second data when the pattern detection circuit is enabled;

It can also be set that the input data belongs to the enable range of the pattern detection module 1061 only when D1<7>=D2<7> and D1<6>=D2<6> are both satisfied. For example, for 8-bit data, when IPE=1, D1<7> and D2<7> as well as D1<6> and D2<6> are compared; at this time, the enabling condition is satisfied only when D1<7>≠D2<7> and D1<6>≠D2<6> are both satisfied.

When D1<7>=0, D2<7>=1, D1∈(0,127), D2∈(128,255);

when D1<6>=0, D2<6>=1, D1∈(0,63)∪(128,191), D2∈(64,127)∪(192,255);

when D1<7>=1, D2<7>=0, D1∈(128,255), D2∈(0,127);

when D2<7>=0, D2<6>=1, D1∈(64,127)∪(192,255), D2∈(0,63)∪(128,191).

Therefore,

D1∈(0,63), D2∈(0,191), D1<7>=D2<7> or D1<6>=D2<6>, the input data Data does not belong to the enable range of the pattern detection module 1061;

D1∈(0,63), D2∈(192,255), D1<7>≠D2<7> and D1<6>≠D2<6>, the input data Data belongs to the enable range of the pattern detection module 1061;

D1∈(192,255), D2∈(0,63), D1<7>≠D2<7> and D1<6>≠D2<6>, the input data Data belongs to the enable range of the pattern detection module 1061;

D1∈(192,255), D2∈(0,191), D1<7>=D2<7> or D1<6>=D2<6>, the input data Data does not belong to the enable range of the pattern detection module 1061;

D1∈(0,63), D2∈(0,63), D1<7>=D2<7> or D1<6>=D2<6>, the input data Data does not belong to the enable range of the pattern detection module 1061;

D1∈(0,63), D2∈(64,255), D1<7>≠D2<7> and D1<6>≠D2<6>, the input data Data belongs to the enable range of the pattern detection module 1061;

D1∈(192,255), D2∈(0,191), D1<7>≠D2<7>, the input data Data belongs to the enable range of the pattern detection module 1061;

D1∈(192,255), D2∈(192,255), D1<7>=D2<7>, the input data Data does not belong to the enable range of the pattern detection module 1061.

Optionally, the gamma voltage supplier 105 comprises a plurality of different gray-scale voltage output terminals, and the decoder 104 comprises a plurality of gray-scale voltage input terminals corresponding to the different gray-scale voltage output terminals.

The pre-emphasis module 1062 comprises n sub-control modules, n≥1, and each of the sub-control modules is connected between a designated gray-scale voltage output terminal and a designated gray-scale voltage input terminal, and is configured to perform pre-emphasis control on output of a designated gray-scale voltage.

Specifically, the pre-emphasis module 1062 receives the gray-scale voltage corresponding to the current input data output by the gamma voltage supplier 105, determines whether to pre-emphasize the gray-scale voltage corresponding to the current input data according to the control signal and the gray-scale values corresponding to the current input data, and outputs to an input terminal of the gray-scale voltage corresponding to the current input data in the decoder 104.

Figure 5:
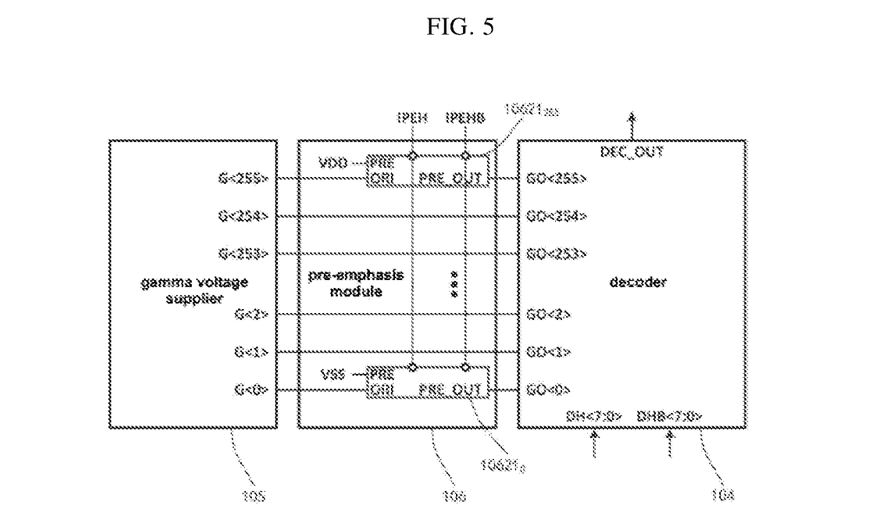
FIG. 5 is a schematic structural diagram illustrating a pre-emphasis module of a pre-emphasis circuit according to an embodiment of the present application.

FIG. 5 illustrates a schematic structural diagram of the pre-emphasis module 1062 in the case of an 8-bit input signal. As shown in FIG. 5, the gamma voltage supplier 105 has voltage output terminals G<0>~G<255> corresponding to 255 grayscales of the 8-bit input data, and the decoder 104 has voltage input terminals GO<0>~GO<255> corresponding to 255 grayscales. According to the settings, there is at least one sub-control module in the pre-emphasis module. As an example, the pre-emphasis module shown in FIG. 5 has a sub-control module 10621$_0$ between G<0> and GO<0> corresponding to 0 grayscale, and a sub-control module 10621$_{255}$ between G<255> and GO<255> corresponding to 255 grayscale.

Specifically, in FIGS. 3 and 5, after the input data D1<7:0> is boosted by the first level shifter 103, the high-voltage data signal DH<7:0> and the inverted signal DHB<7:0> of the input data are obtained and output to the decoder 104. The gamma voltage supplier 105 provides 255 gray-scale voltages, corresponding to 255 gray-scale values, respectively. For example, DH<7:0>="11111111", it corresponds to 255 grayscales, and corresponds to the G<255> terminal of the gamma voltage supplier; DH<7:0>="00000000", it corresponds to 0 grayscale, and corresponds to G<0> terminal of the gamma voltage supplier 105; DH<7:0>="10000000", it corresponds to 128 grayscales, and corresponds to the output terminal G<128> terminal of the gamma voltage supplier 105. Thereafter, the pre-emphasis module 1062 determines whether to pre-emphasize the input data according to the gray-scale voltage provided by the voltage terminal of the gamma voltage supplier and the control signal provided by the pattern detection module 1061. For example, in FIG. 5, when the DH<7:0>="11111111", which corresponds to the sub-control module 10621$_{255}$ between G<255> and GO<255>, and thus when the control signals IPEH and IPEHB are respectively "1" and "0", a voltage output to GO<255> is pre-emphasis voltage (output VDD in FIG. 5) corresponding to the gray-scale of the current input data. When DH<7:0>="10000000", the 128 grayscales are not within the pre-emphasis range of the pre-emphasis module shown in FIG. 5. Therefore, at this time, regardless of the control signal, GO<255> is equal to G<255>, and no pre-emphasis is required.

The following table shows voltage values output by the pre-emphasis module 1062 when DH<7:0>="11111111", DH<7:0>="00000000" and DH<7:0>="10000000":

| DH<7:0> | corresponding grayscale | IPEH | IPEHB | output terminal of gamma voltage supplier | receive terminal of decoder |
|---|---|---|---|---|---|
| 11111111 | 255 | 0 | 1 | G<255> | GO<255> = G<255> |
| 11111111 | 255 | 1 | 0 | G<255> | GO<255> = VDD |
| 00000000 | 0 | 0 | 1 | G<0> | GO<0> = G<0> |
| 00000000 | 0 | 1 | 0 | G<0> | GO<0> = VSS |
| 10000000 | 128 | 0 | 1 | G<128> | GO<128> = G<128> |
| 10000000 | 128 | 1 | 0 | G<128> | GO<128> = G<128> |

The above-mentioned sub-control module is only an implementation according to the present disclosure. Specifically, the sub-control module 10621 may be provided between different G<x> and GO<x> according to different situations.

Figure 6:
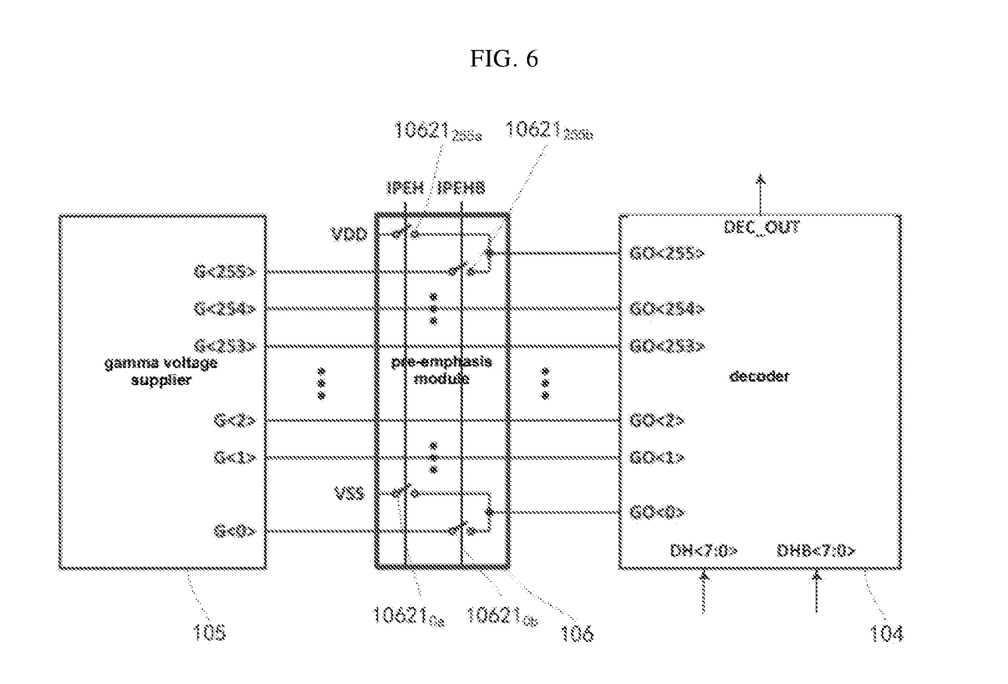
FIG. 6 is a schematic structural diagram illustrating a pre-emphasis module of a pre-emphasis circuit according to an embodiment of the present application.

Optionally, the sub-control module comprises a first switch and a second switch.

An end of the first switch is connected to a designated gray-scale voltage output terminal of the gamma voltage supplier 105, and another end of the first switch is connected to a pre-emphasis output terminal for outputting the designated gray-scale voltage of the pre-emphasis module.

The first switch is controlled to be turned on or turned off according to a value of the control signal.

An end of the second switch is connected to a pre-emphasis input voltage, and another end of the second switch is connected to the pre-emphasis output terminal of the designated gray-scale voltage.

The second switch is controlled to be turned on or turned off according to the value of the control signal.

The pre-emphasis output terminal of the designated gray-scale voltage is connected to an input terminal of the decoder corresponding to the designated gray-scale voltage.

Specifically, referring to FIG. 6, as shown, the first switch is shown as "a", and the second switch is shown as "b", the sub-control module 10621 as shown controls the first switch and the second switch by using the IPEH and IPEHB signals to output voltage of grayscale corresponding to the current input data directly or output pre-emphasis voltage of grayscale corresponding to the current input data. For example, the pre-emphasis module 106 in FIG. 6 has sub-control modules between 255 grayscale and 0 grayscale. Taking the sub-control module between G<255> and GO<255> as an example, the first switch is 10621$_{255a}$, the second switch is 10621$_{255b}$, and when the first switch control signal IPEH=1, the first switch is closed, when IPEH=0, the first switch is open; when the second switch control signal IPEHB=1, the second switch is closed, when IPEHB=0, the second switch is open. In this way, the pre-emphasis module 106 can determine whether to pre-emphasize the gray-scale voltage corresponding to the current input data according to the control signal.

Optionally, the sub-control module comprises a multiplexer.

Input terminals of the multiplexer are respectively connected to the designated gray-scale voltage output terminal of the gamma voltage supplier and a pre-emphasis input voltage terminal, and an output terminal of the multiplexer is a pre-emphasis output terminal of the designated gray-scale voltage, the pre-emphasis output terminal of the designated gray-scale voltage is connected to the input terminal of the decoder corresponding to the designated gray-scale voltage.

The multiplexer determines whether to select the pre-emphasized voltage of a designated grayscale by using the value of the control signal.

Specifically, in FIG. 5, the applied sub-control module is the multiplexer, taking the multiplexer $10621_{255}$ between G<255> and GO<255> as an example:

when IPEH=1, IPEHB=0, the output terminal PRE_OUT of the multiplexer is connected to the PRE terminal, that is, at this time, the voltage output by G<255> is emphasized and then output, and the emphasized voltage VDD of 255 grayscale is received by the GO<255> terminal; when IPEH=0, IPEHB=1, the output terminal PRE_OUT of the multiplexer is connected to the ORI terminal, and the voltage G<255> corresponding to 255 grayscale is directly output to GO<255>.

The pre-emphasis circuit according to the present disclosure can provide the sub-control module 10621 between different G<x> and GO<x> according to different situations. Two other settings of the pre-emphasis output of the pre-emphasis module are described in conjunction with FIGS. 7-8.

Figure 7:
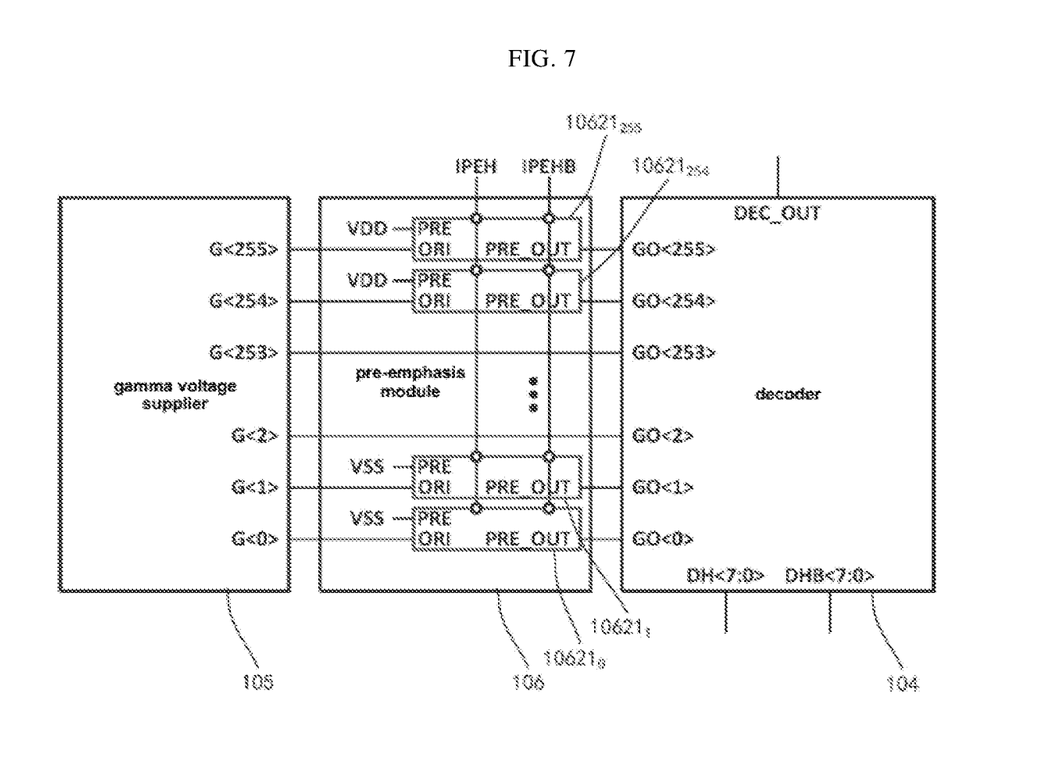
FIG. 7 is a schematic structural diagram illustrating a pre-emphasis module of a pre-emphasis circuit according to an embodiment of the present application.

Referring to FIG. 7, multiplexers are provided on the output circuits corresponding to grayscales of 0, 1, 254, and 255. In FIG. 7, the pre-emphasis module is set to (G<255>–VDD)/(G<254>–VDD)/(G<1>–VSS)/(G<0>–VSS), for example, different input data values and the corresponding output results (& means sum) are listed as follows:

Example 1: DH<7:0>='11111111' & IPEH='0': PRE_OUT=G<255>;
Example 2: DH<7:0>='11111111' & IPEH='1': PRE_OUT=VDD;
Example 3: DH<7:0>='11111110' & IPEH='0': PRE_OUT=G<254>;
Example 4: DH<7:0>='11111110' & IPEH='1': PRE_OUT=VDD;
Example 5: DH<7:0>='11111101' & IPEH='0': PRE_OUT=G<253>;
Example 6: DH<7:0>='11111101' & IPEH='1': PRE_OUT=G<253>;
Example 7: DH<7:0>='00000010' & IPEH='0': PRE_OUT=G<2>;
Example 8: DH<7:0>='00000010' & IPEH='1': PRE_OUT=G<2>;
Example 9: DH<7:0>='00000001' & IPEH='0': PRE_OUT=G<1>;
Example 10: DH<7:0>='00000001' & IPEH='1': PRE_OUT=VSS;
Example 11: DH<7:0>='00000000' & IPEH='0': PRE_OUT=G<0>;
Example 12: DH<7:0>='00000000' & IPEH='1': PRE_OUT=VSS.

Figure 8:
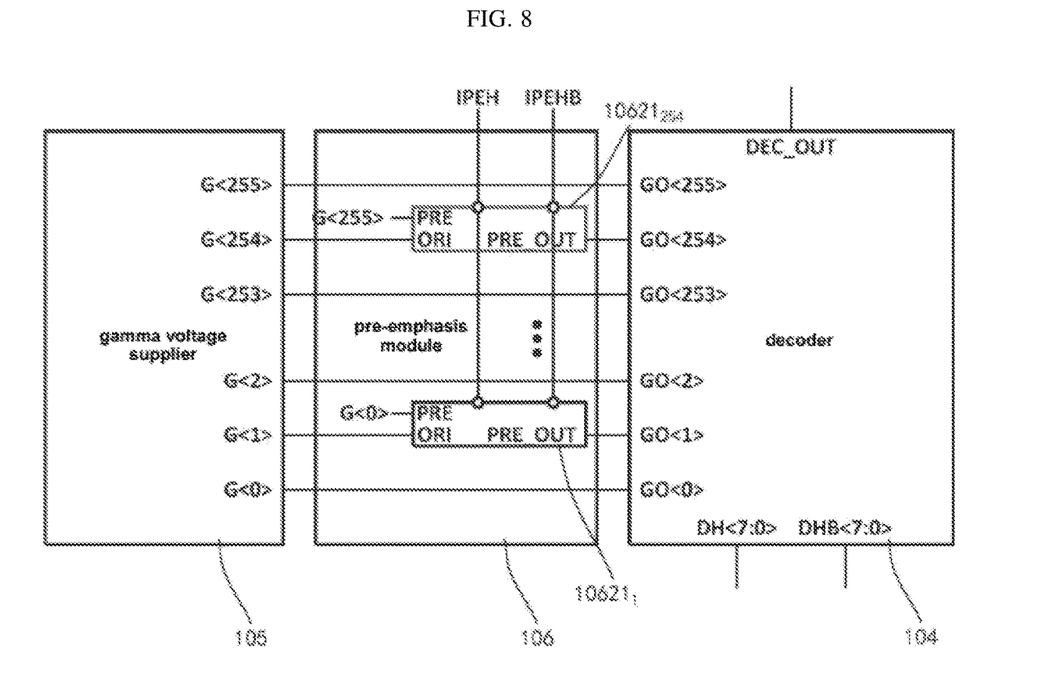
FIG. 8 is a schematic structural diagram illustrating a pre-emphasis module of a pre-emphasis circuit according to an embodiment of the present application.

Referring to FIG. 8, multiplexers are provided on the output circuits corresponding to grayscales of 1 and 254 respectively. In FIG. 8, the pre-emphasis module is set to (G<254>–G<255>)/(G<1>–G<0>). For example, different input data values and the corresponding output results (& means sum) are listed as follows:

Example 1: DH<7:0>='11111111' & IPEH='0': PRE_OUT=G<255>;
Example 2: DH<7:0>='11111111' & IPEH='1': PRE_OUT=G<255>;
Example 3: DH<7:0>='11111110' & IPEH='0': PRE_OUT=G<254>;
Example 4: DH<7:0>='11111110' & IPEH='1': PRE_OUT=G<255>;
Example 5: DH<7:0>='11111101' & IPEH='0': PRE_OUT=G<253>;
Example 6: DH<7:0>='11111101' & IPEH='1': PRE_OUT=G<253>;
Example 7: DH<7:0>='00000010' & IPEH='0': PRE_OUT=G<2>;
Example 8: DH<7:0>='00000010' & IPEH='1': PRE_OUT=G<2>;
Example 9: DH<7:0>='00000001' & IPEH='0': PRE_OUT=G<1>;
Example 10: DH<7:0>='00000001' & IPEH='1': PRE_OUT=G<0>;
Example 11: DH<7:0>='00000000' & IPEH='0': PRE_OUT=G<0>;
Example 12: DH<7:0>='00000000' & IPEH='1': PRE_OUT=G<0>.

Figure 9:
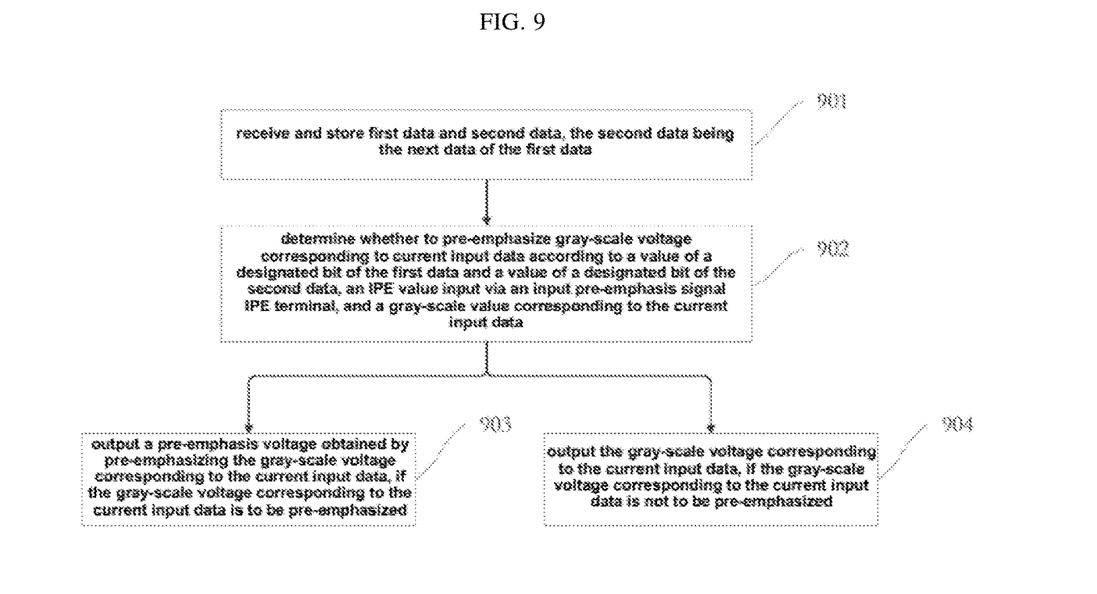
FIG. 9 is a flowchart illustrating a pre-emphasis method according to an embodiment of the present application.

At one aspect, referring to FIG. 9, an embodiment of the present disclosure provides a pre-emphasis method applied to the pre-emphasis circuit according to an embodiment of the present disclosure, comprising:

step 901, receiving and storing first data and second data, and the second data is the next data of the first data;

step 902, determining whether to pre-emphasize gray-scale voltage corresponding to current input data according to a value of a designated bit of the first data and a value of a designated bit of the second data, an input pre-emphasis signal value input via an input pre-emphasis signal terminal, and a gray-scale value corresponding to the current input data;

step 903, outputting a pre-emphasis voltage which is a voltage obtained by pre-emphasizing the gray-scale voltage corresponding to the current input data, if it is determined that the gray-scale voltage corresponding to the current input data is to be pre-emphasized;

step 904, outputting the gray-scale voltage corresponding to the current input data, if it is determined that the gray-scale voltage corresponding to the current input data is not to be pre-emphasized.

By comparing the value of the designated bit of the first data and the value of the designated bit of the second data, the difference between the first data and the second data can be determined. The difference threshold between the first data and the second data can be extended or reduced, and the enable range of the pre-emphasis module can be adjusted, by comparing the values of different number of bits of the first data and the second data. It is possible to pre-emphasize the current input data only when the IPE signal is the pre-emphasis enable indication, and the gray-scale value of the current input data also belongs to the pre-emphasis range.

Optionally, the step 102, the determining whether to pre-emphasize the gray-scale voltage corresponding to the current input data according to the value of the designated bit of the first data and the value of the designated bit of the second data, the IPE value input via the input pre-emphasis signal IPE terminal, and the gray-scale value corresponding to the current input data, comprises:

it is possible to pre-emphasize the gray-scale voltage corresponding to the current input data, when the value of the designated bit of the first data is not equal to the value of the designated bit of the second data, and IPE=1; and it is unnecessary to pre-emphasize the gray-scale voltage corresponding to the current input data, when the value of the designated bit of the first data is equal to the value of the designated bit of the second data, or IPE=0.

It is possible to pre-emphasize the current input data only when IPE=1, and the value of the designated bit of the first data and the value of the designated bit of the second data are not equal to each other, that is, the difference between the first data and the second data is large, and the display pattern changes greatly.

Optionally, that it is possible to pre-emphasize the gray-scale voltage corresponding to the current input data comprises:

outputting a pre-emphasis voltage, which is a voltage obtained by pre-emphasizing the gray-scale voltage corresponding to the current input data, if the gray-scale value corresponding to the current input data belongs to a pre-emphasis gray-scale range; and outputting the gray-scale voltage corresponding to the current input data, if the grayscale value corresponding to the current input data does not belong to the pre-emphasis gray-scale range. When it is possible to pre-emphasize the gray-scale voltage corresponding to the current input data, the gray-scale value corresponding to the current input data needs to belong to the pre-emphasis gray-scale range, then the pre-emphasizing is performed on the gray-scale voltage corresponding to the current input data, and the voltage obtained by pre-emphasizing the gray-scale voltage corresponding to the current input data is output. According to the description of the pre-emphasis circuit implementation, the pre-emphasis grayscale range can be adjusted.

Figure 10:
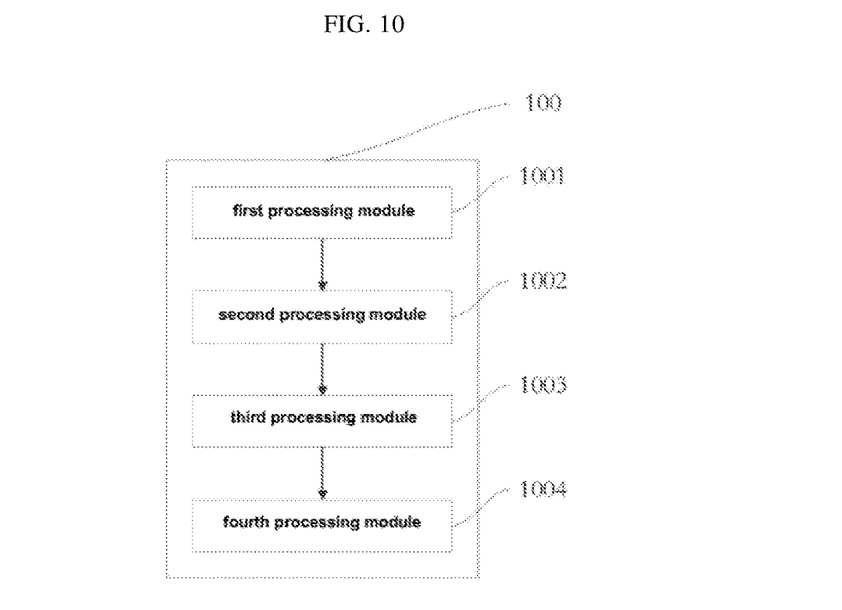
FIG. 10 is a schematic structural diagram illustrating a pre-emphasis device according to an embodiment of the present application.

Referring to FIG. 10, an embodiment of the present disclosure discloses a pre-emphasis device 100, comprising:

a first processing module 1001 configured to receive and store first data and second data, the second data being next to the first data;

a second processing module 1002 configured to determine whether to pre-emphasize gray-scale voltage corresponding to current input data according to a value of a designated bit of the first data and a value of a designated bit of the second data, an IPE value input via an input pre-emphasis signal IPE terminal, and a gray-scale value corresponding to the current input data; a third processing module 1003 configured to output a pre-emphasis voltage, which is a voltage obtained by pre-emphasizing the gray-scale voltage corresponding to the current input data, if it is necessary to pre-emphasize the gray-scale voltage corresponding to the current input data; and a fourth processing module 1004 configured to output the gray-scale voltage corresponding to the current input data if it is unnecessary to pre-emphasize the gray-scale voltage corresponding to the current input data.

Figure 11:
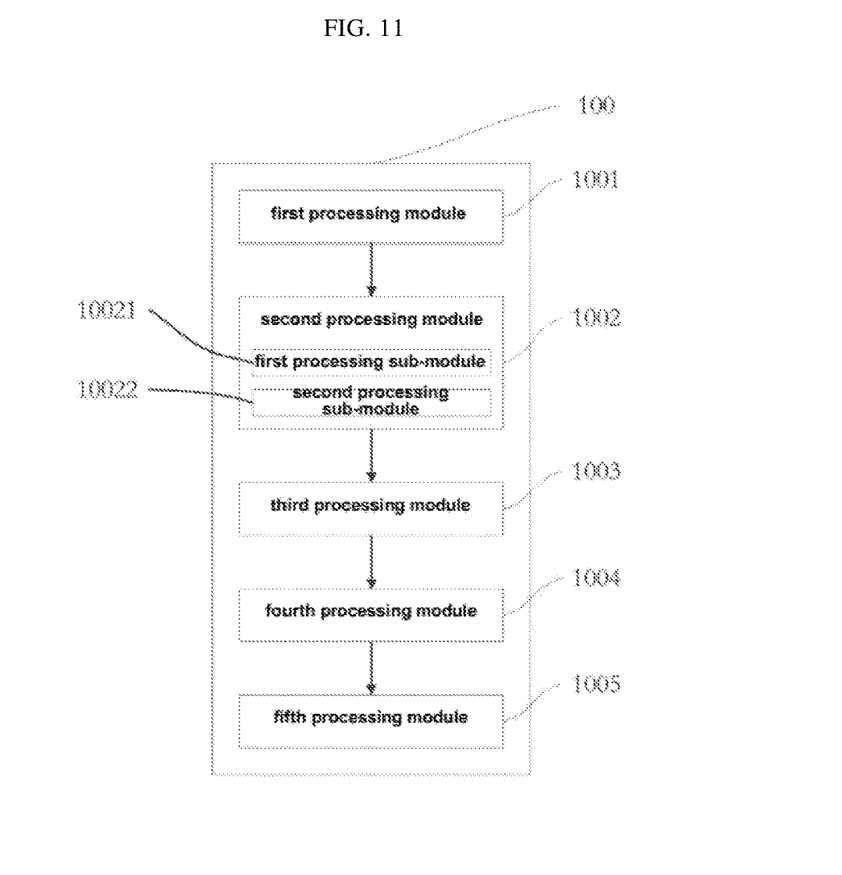
FIG. 11 is a schematic structural diagram illustrating a pre-emphasis device according to an embodiment of the present application.

Optionally, referring to FIG. 11, the second processing module 1002 comprises:

a first processing sub-module 10021, configured to pre-emphasize the gray-scale voltage corresponding to the current input data when the value of the designated bit of the first data and the value of the designated bit of the second data are not equal and IPE=1;

a second processing sub-module 10022, configured to not perform the pre-emphasis on the gray-scale voltage corresponding to the current input data when the value of the designated bit of the first data and the value of the designated bit of the second data are equal to each other or IPE=0.

Optionally, referring to FIG. 11, the device 100 further comprise:

a fifth processing module 1005, configured to pre-emphasize the gray-scale voltage corresponding to the current input data when the value of the designated bit of the first data and the value of the designated bit of the second data are not equal to each other.

In particular, pre-emphasizing the gray-scale voltage corresponding to the current input data comprises: outputting a pre-emphasis voltage, which is a voltage obtained by pre-emphasizing the gray-scale voltage corresponding to the current input data, if the gray-scale value corresponding to the current input data belongs to a pre-emphasis gray-scale range; and outputting the gray-scale voltage corresponding to the current input data, if the grayscale value corresponding to the current input data does not belong to the pre-emphasis gray-scale range.

At one aspect, an embodiment of the present disclosure provides a source driver chip comprising the pre-emphasis circuit according to an embodiment of the present disclosure.

At one aspect, an embodiment of the present disclosure provides a display device comprising the source driver chip according to an embodiment of the present disclosure.

Figure 12:
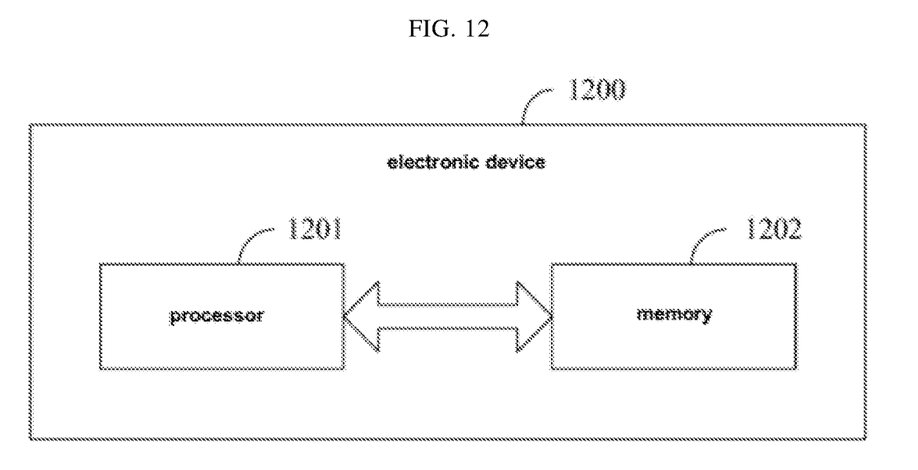
FIG. 12 is a schematic structural diagram illustrating an electronic device according to an embodiment of the present application.

Referring to FIG. 12, an embodiment of the present disclosure further provide an electronic device 1200 comprising a processor 1201, a memory 1202 and computer program stored on the memory 1202 and executable on the processor 1201, when the computer program is executed by the processor 1201, each process of an embodiment of the pre-emphasis methods described as above is implemented, and the same technical effect can be achieved. To avoid repetition, details are not described herein.

An embodiment of the present disclosure also provide a computer-readable storage medium on which a computer program is stored. When the computer program is executed by a processor, each process of the embodiment of the above-mentioned pre-emphasis method is implemented, and the same technical effect can be achieved. To avoid repetition, details are not described herein again. Wherein, the computer-readable storage medium comprises, such as Read-Only Memory (ROM), Random Access Memory (RAM), magnetic disk, or optical disk, etc.

It should be noted that the terms "include(s)", "comprise(s)" or any other variants thereof used herein are intended to cover non-exclusive inclusion, so that a process, method, article or device including a series of elements not only includes those elements, but also includes other elements that are not explicitly listed, or elements inherent to the process, method, article, or device. If there are no more restrictions, the element defined by the sentence "including a . . . " does not exclude the existence of other identical elements in the process, method, article, or device that includes the element.

Through the description of the above embodiments, those skilled in the art can clearly understand that the method of the above embodiments can be implemented by means of software and the necessary general hardware platform and can also be implemented by using hardware, but in many cases the former is the better implementation. Based on this understanding, the technical solution of the present disclosure essentially or the part that contributes to the existing technology can be embodied in the form of a software product, and the computer software product is stored in a storage medium (such as ROM/RAM, magnetic disk, optical disc) which includes several instructions to make a terminal (which may be a mobile phone, a computer, a server, an air conditioner, or a network device, etc.) perform the methods described in the various embodiments of the present disclosure.

Obviously, the foregoing embodiments are merely examples for clear description, and are not intended to limit the implementation manners. For those skilled in the art, other changes or modifications in different forms can be made on the basis of the above description. It is not necessary and impossible to list all implementation methods here. The obvious changes or changes derived from this are still within the scope of protection created by this disclosure.

What is claimed is:

1. A pre-emphasis circuit, comprising:
 a first latch configured to receive and store first data and output the first data;
 a second latch configured to receive and store second data and output the second data, the second data being next to the first data;
 a decoder;
 a gamma voltage supplier;
 a first level shifter configured to boost the first data, high-voltage data signal obtained through the boosting being used as current input data of the decoder; and
 an amplifier input pre-emphasis module connected to the gamma voltage supplier, the decoder, an input pre-emphasis signal terminal, the first latch and the second latch, and configured to determine whether to pre-emphasize gray-scale voltage corresponding to the current input data according to a value of a designated bit of the first data and a value of a designated bit of the second data, an input pre-emphasis signal value input via the input pre-emphasis signal terminal, and a gray-scale value corresponding to the current input data;
 wherein, if it is determined that the gray-scale voltage corresponding to the current input data is to be pre-emphasized, a pre-emphasis voltage is output to the decoder, the pre-emphasis voltage being a voltage obtained by pre-emphasizing the gray-scale voltage corresponding to the current input data; and
 if it is determined that the gray-scale voltage corresponding to the current input data is not to be pre-emphasized, the gray-scale voltage corresponding to the current input data is output to the decoder.

2. The pre-emphasis circuit according to claim 1, wherein the amplifier input pre-emphasis module comprises:
 a pattern detection module connected to the first latch and the second latch, configured to determine whether to pre-emphasize the gray-scale voltage corresponding to the current input data according to the value of the designated bit of the first data, the value of the designated bit of the second data and the input pre-emphasis signal values, and output a control signal; and
 a pre-emphasis module connected to an output terminal of the pattern detection module, an output terminal of the gamma voltage supplier and an input terminal of the decoder, configured to determine whether to pre-emphasize the gray-scale voltage corresponding to the current input data according to the control signal provided by the pattern detection module and the gray-scale value corresponding to the current input data.

3. The pre-emphasis circuit according to claim 2, wherein the pattern detection module comprises an XOR gate circuit, an AND gate circuit, a D flip-flop and a second level shifter, and
 wherein an input terminal of the XOR gate circuit is connected to the first latch and the second latch, and the XOR gate circuit is configured to determine whether the value of the designated bit of the first data is equal to the value of the designated bit of the second data, and output a result of the determination;
 an output terminal of the XOR gate circuit is connected to a D terminal of the D flip-flop, an input terminal of the AND gate circuit is connected to a Q terminal of the D flip-flop, another input terminal of the AND gate circuit is connected to the input pre-emphasis signal terminal, and the AND gate circuit is configured to determine whether it is possible to pre-emphasize the gray-scale voltage corresponding to the current input data according to the result of the determination of the XOR gate circuit and the input pre-emphasis signal value;
 when the value of the designated bit of the first data is not equal to the value of the designated bit of the second data, and the input pre-emphasis signal value is 1, a determination result that it is possible to pre-emphasize the gray-scale voltage corresponding to the current input data is obtained and output;
 when the value of the designated bit of the first data is equal to the value of the designated bit of the second data, or the input pre-emphasis signal value is 0, a determination result of unnecessarily pre-emphasizing the gray-scale voltage corresponding to the current input data is obtained and output; and
 the second level shifter is connected to an output terminal of the AND gate circuit and configured to provide the control signal to the pre-emphasis module.

4. The pre-emphasis circuit according to claim 1, wherein the value of the designated bit of the first data and the value of the designated bit of the second data comprises:
 a value D1<x> of an x-th bit of the first data, and a value D2<x> of an x-th bit of the second data.

5. The pre-emphasis circuit according to claim 4, wherein the x-th bits are respective most significant bits of the first data and/or the second data.

6. The pre-emphasis circuit according to claim 2, wherein
 the gamma voltage supplier comprises a plurality of different gray-scale voltage output terminals, and the decoder comprises a plurality of gray-scale voltage input terminals corresponding to the different gray-scale voltage output terminals;
 the pre-emphasis module comprises n sub-control modules, n≥1, and each of the sub-control modules is connected between a designated gray-scale voltage output terminal and a designated gray-scale voltage input terminal and is configured to perform a pre-emphasis control on the output designated gray-scale voltage.

7. The pre-emphasis circuit according to claim 6, wherein each of the sub-control modules comprises a first switch and a second switch;
 an end of the first switch is connected to the designated gray-scale voltage output terminal of the gamma voltage supplier, and another end of the first switch is connected to a pre-emphasis output terminal of the pre-emphasis module for outputting the designated gray-scale voltage;
 the first switch is controlled to be turned on or turned off according to a value of the control signal;
 an end of the second switch is connected to a pre-emphasis input voltage, and another end of the second switch is connected to the pre-emphasis output terminal of the designated gray-scale voltage;
 the second switch is controlled to be turned on or turned off according to the value of the control signal;
 the pre-emphasis output terminal of the designated gray-scale voltage is connected to an input terminal of the decoder corresponding to the designated gray-scale voltage.

8. The pre-emphasis circuit according to claim 6, wherein each of the sub-control modules comprises a multiplexer, input terminals of the multiplexer are respectively connected to the designated gray-scale voltage output terminal of the gamma voltage supplier and a pre-emphasis input voltage terminal, and an output terminal of the multiplexer is a pre-emphasis output terminal of the designated gray-scale voltage, the pre-emphasis output terminal of the designated gray-scale voltage is connected to the input terminal of the decoder corresponding to the designated gray-scale voltage;

the multiplexer determines whether to select the pre-emphasized voltage of a designated grayscale by using the value of the control signal.

9. A pre-emphasis method applied to the pre-emphasis circuit according to claim 1, the method comprises:

receiving and storing first data and second data, the second data being next to the first data;

determining whether to pre-emphasize a gray-scale voltage corresponding to current input data according to a value of a designated bit of the first data and a value of a designated bit of the second data, an input pre-emphasis signal value input via an input pre-emphasis signal terminal, and a gray-scale value corresponding to the current input data;

outputting a pre-emphasis voltage which is a voltage obtained by pre-emphasizing the gray-scale voltage corresponding to the current input data, if it is determined that the gray-scale voltage corresponding to the current input data is to be pre-emphasized; and outputting the gray-scale voltage corresponding to the current input data, if it is determined that the gray-scale voltage corresponding to the current input data is not to be pre-emphasized.

10. The pre-emphasis method according to claim 9, wherein the determining whether to pre-emphasize the gray-scale voltage corresponding to the current input data according to the value of the designated bit of the first data and the value of the designated bit of the second data, the input pre-emphasis signal value input via the input pre-emphasis signal terminal, and the gray-scale value corresponding to the current input data comprises:

it is possible to pre-emphasize the gray-scale voltage corresponding to the current input data, when the value of the designated bit of the first data is not equal to the value of the designated bit of the second data, and the input pre-emphasis signal value is 1; and it is unnecessary to pre-emphasize the gray-scale voltage corresponding to the current input data, when the value of the designated bit of the first data is equal to the value of the designated bit of the second data, or the input pre-emphasis signal value is 0.

11. The pre-emphasis method according to claim 10, wherein that it is possible to pre-emphasize the gray-scale voltage corresponding to the current input data comprises:

outputting a pre-emphasis voltage which is a voltage obtained by pre-emphasizing the gray-scale voltage corresponding to the current input data, if the gray-scale value corresponding to the current input data belongs to a pre-emphasis gray-scale range; and outputting the gray-scale voltage corresponding to the current input data, if the grayscale value corresponding to the current input data does not belong to the pre-emphasis gray-scale range.

12. A pre-emphasis device, comprising:

a first processing module configured to receive and store first data and second data, the second data being next to the first data; and a second processing module configured to determine whether to pre-emphasize gray-scale voltage corresponding to current input data according to a value of a designated bit of the first data and a value of a designated bit of the second data, an input pre-emphasis signal value input via an input pre-emphasis signal terminal, and a gray-scale value corresponding to the current input data;

the second processing module is further configured to:

output a pre-emphasis voltage, which is a voltage obtained by pre-emphasizing the gray-scale voltage corresponding to the current input data, if it is determined that the gray-scale voltage corresponding to the current input data is to be pre-emphasized; and output the gray-scale voltage corresponding to the current input data, if it is determined that the gray-scale voltage corresponding to the current input data is not to be pre-emphasized.

13. A source driver chip comprising the pre-emphasis circuit according to claim 1.

14. A display device comprising the source driver chip according to claim 13.

15. An electronic device comprising a processor, a memory and computer program stored on the memory and executable on the processor, when the computer program is executed by the processor, the pre-emphasis method according to claim 9 is implemented.

16. A pre-emphasis method applied to the pre-emphasis circuit according to claim 2, the method comprises:

receiving and storing first data and second data, the second data being next to the first data;

determining whether to pre-emphasize a gray-scale voltage corresponding to current input data according to a value of a designated bit of the first data and a value of a designated bit of the second data, an input pre-emphasis signal value input via an input pre-emphasis signal terminal, and a gray-scale value corresponding to the current input data;

outputting a pre-emphasis voltage which is a voltage obtained by pre-emphasizing the gray-scale voltage corresponding to the current input data, if it is determined that the gray-scale voltage corresponding to the current input data is to be pre-emphasized; and outputting the gray-scale voltage corresponding to the current input data, if it is determined that the gray-scale voltage corresponding to the current input data is not to be pre-emphasized.

17. A pre-emphasis method applied to the pre-emphasis circuit according to claim 4, the method comprises:

receiving and storing first data and second data, the second data being next to the first data;

determining whether to pre-emphasize a gray-scale voltage corresponding to current input data according to a value of a designated bit of the first data and a value of a designated bit of the second data, an input pre-emphasis signal value input via an input pre-emphasis signal terminal, and a gray-scale value corresponding to the current input data;

outputting a pre-emphasis voltage which is a voltage obtained by pre-emphasizing the gray-scale voltage corresponding to the current input data, if it is determined that the gray-scale voltage corresponding to the current input data is to be pre-emphasized; and outputting the gray-scale voltage corresponding to the current input data, if it is determined that the gray-scale voltage corresponding to the current input data is not to be pre-emphasized.

18. A source driver chip comprising the pre-emphasis circuit according to claim 2.

19. A source driver chip comprising the pre-emphasis circuit according to claim 4.

20. A source driver chip comprising the pre-emphasis circuit according to claim 5.

\* \* \* \* \*